US008242000B2

(12) United States Patent
Hsu

(10) Patent No.: US 8,242,000 B2
(45) Date of Patent: Aug. 14, 2012

(54) METHOD FOR MAKING NANOWIRE ELEMENT

(75) Inventor: Chia-Ling Hsu, Taipei Hsien (TW)

(73) Assignee: Hon Hai Precision Industry Co., Ltd., Tu-Cheng, New Taipei (TW)

(*) Notice: Subject to any disclaimer, the term of this patent is extended or adjusted under 35 U.S.C. 154(b) by 95 days.

(21) Appl. No.: 12/915,013

(22) Filed: Oct. 29, 2010

(65) Prior Publication Data

US 2012/0045885 A1 Feb. 23, 2012

(30) Foreign Application Priority Data

Aug. 18, 2010 (TW) .............................. 99127504 A

(51) Int. Cl.
*H01L 21/20* (2006.01)
*H01L 21/36* (2006.01)

(52) U.S. Cl. ............ 438/478; 438/49; 438/73; 438/466; 438/702; 438/745; 977/762; 977/842; 977/932; 257/E21.211; 257/E21.582; 257/E31.069

(58) Field of Classification Search ................... None
See application file for complete search history.

(56) References Cited

U.S. PATENT DOCUMENTS

2009/0173527 A1* 7/2009 Benke et al. ................. 174/261
2009/0242405 A1* 10/2009 Mayer et al. ................. 204/435
2010/0101960 A1* 4/2010 Ohta et al. ................... 204/643

* cited by examiner

*Primary Examiner* — Charles Garber
*Assistant Examiner* — Abdulfattah Mustapha
(74) *Attorney, Agent, or Firm* — Altis Law Group, Inc.

(57) ABSTRACT

A method for making a nanowire element includes: providing an imprint mold including a first substrate and a conductive pattern-transferring layer, the pattern-transferring layer includes first conductive strips; electrifying the pattern-transferring layer with an alternating current; applying a nanowire-containing suspension on the pattern-transferring layer; reorienting the nanowires in the nanowire-containing suspension using a dielectrophoresis method, thereby the nanowires connected between two adjacent first conductive strips; providing a pattern-receiving body, the pattern-receiving body including a second substrate and a pattern-receiving layer; pressing the imprint mold onto the pattern-receiving body with the conductive pattern-transferring layer facing the pattern-receiving layer, thereby defining a patterned recess in the pattern-receiving layer and transferring the nanowires to the second substrate; forming a first conductive layer on the second substrate to obtain a conductive pattern layer, the conductive pattern layer including second conductive strips, the nanowires connecting two adjacent second conductive strips; and removing the pattern-receiving layer.

12 Claims, 8 Drawing Sheets

METHOD FOR MAKING NANOWIRE ELEMENT

BACKGROUND

1. Technical Field

The present disclosure relates to methods for making a nanowire element.

2. Description of Related Art

Nanowire elements have a variety of applications such as in sensors and in transistors, because nanowires show excellent mechanical characteristics, have good quantum effect, and have a high surface to volume ratio. Nanowires can also have metallic, semi-metallic and polymer, characteristics according to the characteristics of the material.

Nanowires are usually grown on a substrate. Due to the size of nanowires, it is difficult for the nanowires to be arranged substantially along the same direction after being collected from the substrate or transferred from one substrate to another substrate.

Therefore, a method for making a nanowire element, which can overcome the above-mentioned problems, is needed.

DETAILED DESCRIPTION

Figure 1:
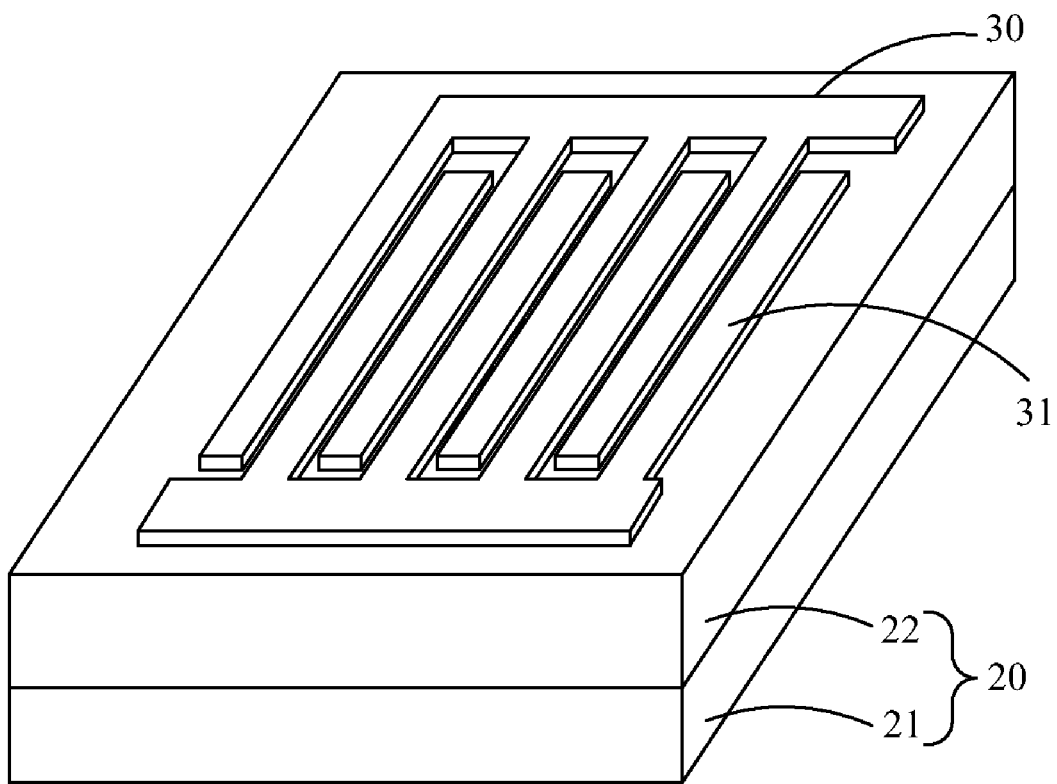
FIGS. 1 to 7 are schematic views of successive stages of a method for making a nanowire element, according to a first embodiment.
Figure 2:
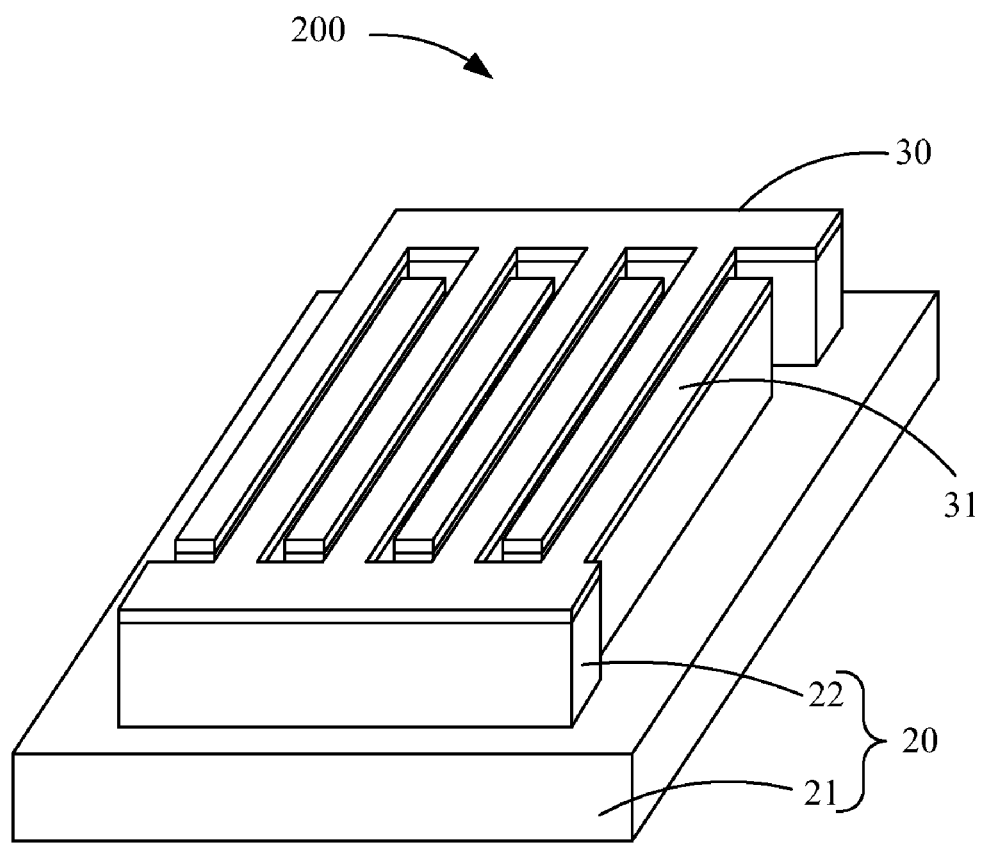
Figure 3:
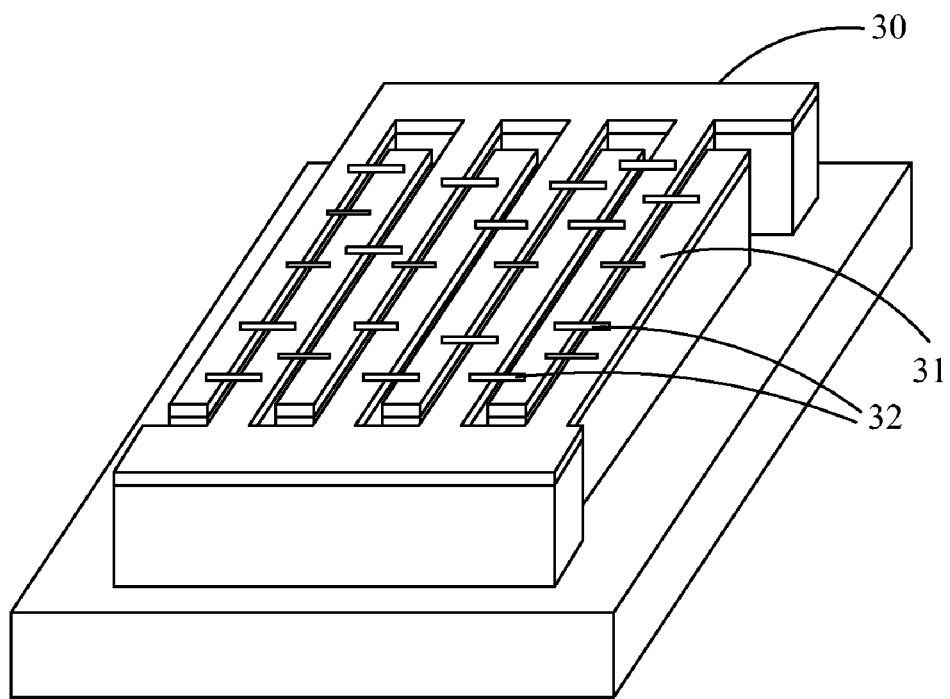
Figure 4:
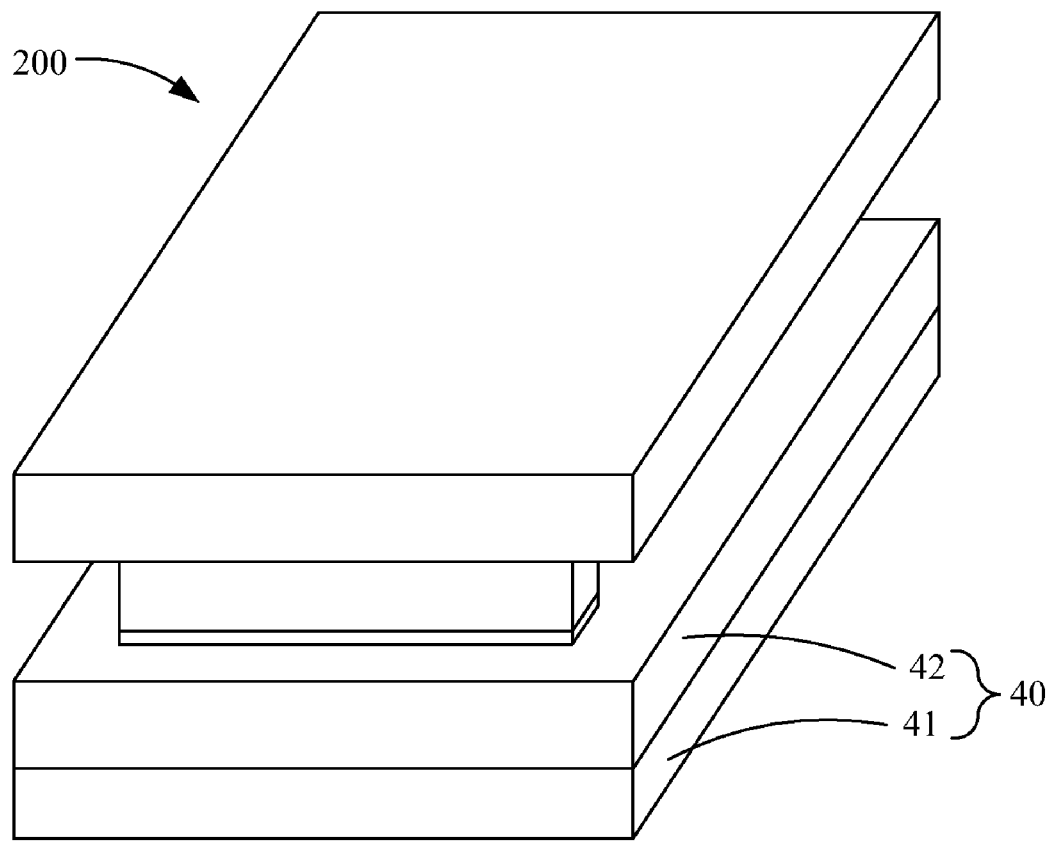
Figure 5:
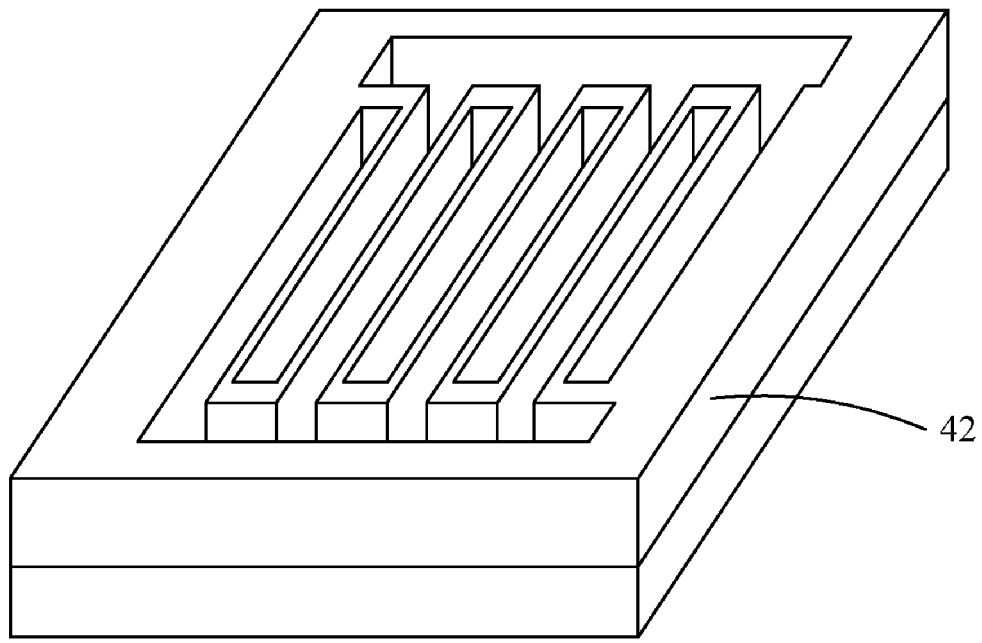
Figure 6:
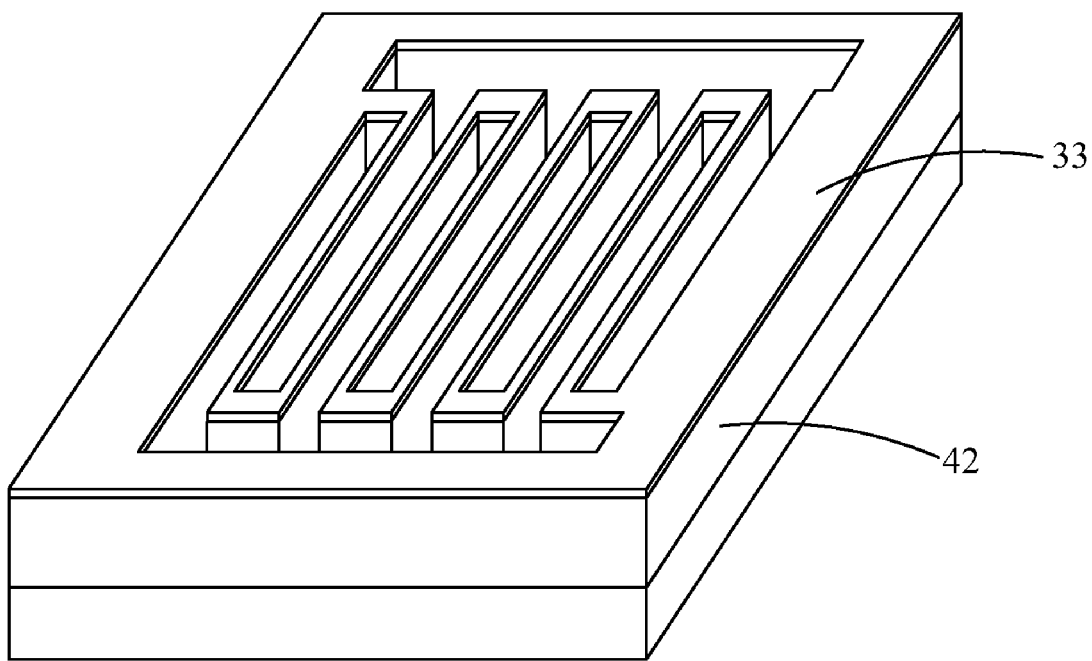
Figure 7:
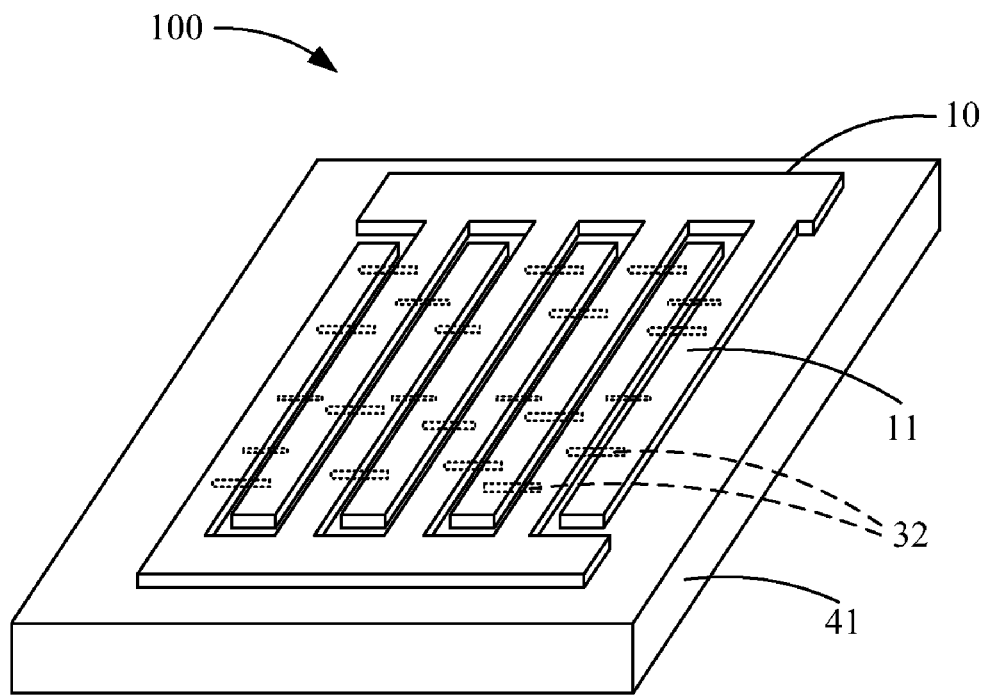

Referring to FIGS. 1 and 7, a method for making a nanowire element 100 includes steps S100 through S112. In step S100: an imprint mold 200 is provided, the imprint mold 200 includes a first substrate 20 and a conductive pattern-transferring layer 30 formed on the first substrate 20, the conductive pattern-transferring layer 30 includes a number of first conductive strips 31 spaced from each other. In step S102: the conductive pattern-transferring layer 30 is electrified with an alternating current. In step S104: a nanowire-containing suspension is applied on the conductive pattern-transferring layer 30, the nanowire-containing suspension containing a number of nanowires 32. In step S105: the nanowires 32 are reoriented using a dielectrophoresis method, thereby the nanowires 32 connected between two adjacent first conductive strips 31. In step S106: a pattern-receiving body 40 is provided, the pattern-receiving body 40 includes a second substrate 41 and a pattern-receiving layer 42 formed on the second substrate 41. In step S108: the imprint mold 200 is pressed onto the pattern-receiving body 40 with the conductive pattern-transferring layer 30 facing the pattern-receiving layer 42, thereby defining a patterned recess in the pattern-receiving layer 42 and transferring the nanowires 32 to the second substrate 41. In step S110: a first conductive layer 33 is formed on the second substrate 41 to obtain a conductive pattern layer 10 in the pattern-receiving layer 42, the conductive pattern layer 10 includes a number of second conductive strips 11, which are spaced from each other, the nanowires 32 connecting two adjacent second conductive strips 11. In step S112: the pattern-receiving layer 42 is removed.

In the step S100, the first substrate 20 includes a silicon base 21, and an imprint pattern layer 22 formed on the silicon base 21. The conductive pattern-transferring layer 30 is formed on the imprint pattern layer 22. The conductive pattern-transferring layer 30 has a first pattern the same as the imprint pattern layer 22. In this embodiment, the first pattern is a double comb pattern. The conductive pattern-transferring layer 30 is a metal layer. Material of the imprint pattern layer 22 may be nitrogen oxide or silicon oxide. The imprint mold 200 can be made using a two-process combination. Referring to FIG. 1, the first process can be a photolithography process to form the conductive pattern-transferring layer 30 on the imprint pattern layer 22. The second process can be a plasma etching process to etch the imprint pattern layer 22 using an $O_2$—$CF_4$ plasma treatment or an $O_2$—$SF_6$ plasma treatment. After etching, the imprint pattern layer 22 has the first pattern. The imprint mold 200 can be recycled for a mass production of the nanowire element 100. This reduces manufacturing cost of the nanowire element 100.

In the step S102, the frequency of the alternating current and voltage applied to the conductive pattern-transferring layer 30 is controlled to adjust the alignment of the nanowires 32. For example, the frequency of the alternating current and voltage applied to the conductive pattern-transferring layer 30 can be enlarged to increase dipole moment of the nanowires 32 in the nanowire-containing suspension, thereby reorienting the nanowires 32 along the direction of an electric field easily.

In the steps S104 and S105, the nanowire-containing suspension is prepared as follows: the nanowires 32 can be removed from a substrate where the nanowires 32 are grown using ultrasonic vibrating. Then the nanowires 32 are collected and added to a solution to form the suspension, for example, ZnO nanowires are added to alcohol. Different nanowire materials require different solutions as long as the polarity of the nanowire is the same as that of the solution. Therefore, the method can be adapted for using various nanowire materials to make nanowire elements. The nanowire-containing suspension is applied on the electrified conductive pattern-transferring layer 30, connecting two adjacent first conductive strips 31. The nanowires 32 are reoriented by the dielectrophoresis method. Therefore, the nanowires 32 can be aligned on the first conductive strips 31. After volatilization of the solution, the nanowires 32 are left to connect/electrically contacting the two adjacent first conductive strips 31.

In the step S106, material of the second substrate 41 is polyethylene terephthalate (PET). The material of the pattern-receiving layer 42 is polymethyl methacrylate (PMMA). The pattern-receiving layer 42 has a second pattern corresponding to the first pattern.

In the step S108, the pattern-receiving body 40 is heated to a glass transition temperature to achieve a desirable viscosity. The pattern-receiving layer 42 is pressed onto the conductive pattern-transferring layer 30 using nanoimprint lithography. After cooling and removing of the pattern-receiving body 40, the nanowires 32 are transferred to the second substrate 41. A mid-portion of the nanowires 32 that is suspended above a gap (not labeled) between the two adjacent first conductive strips 31 in the step S105 is covered by the pattern-receiving layer 42. Two distal ends of the nanowires 32 that are in contact with the two adjacent first conductive strips 31 in the step S105 are exposed by the pattern-receiving layer 42.

In the step S110, the conductive pattern layer 10 has a third pattern corresponding to the second pattern. The third pattern is a double comb pattern. The pattern-receiving layer 42 can serve as a mask. Therefore, the exposed two distal ends of the nanowires 32 in the step S108 are covered by the conductive pattern layer 10, and the covered mid-portion of the nanowires 32 in the step S108 is exposed by the conductive pattern layer 10.

In the step S112, the pattern-receiving layer 42 can be lifted off from the second substrate 41. After removal of the pattern-receiving layer 42, a multi-channel nanowire element 100 is obtained, as shown in FIG. 7. The second conductive strips 11 can be electrodes of the nanowire element 100.

Figure 8:
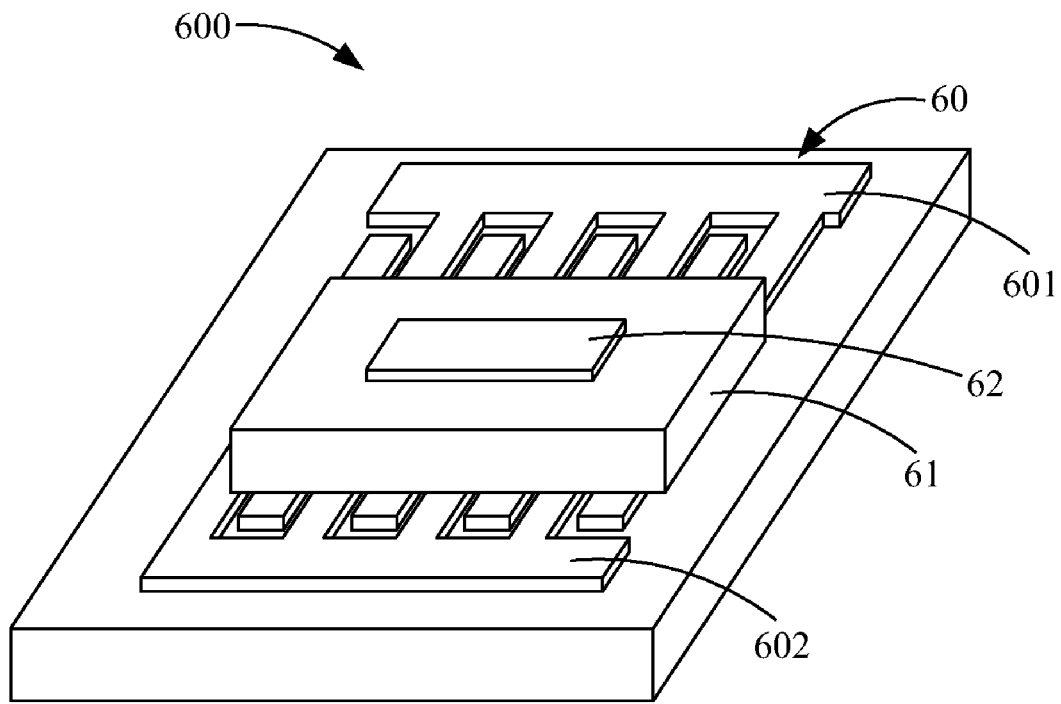
FIG. 8 is a schematic view of a nanowire element made by a method according to a second embodiment.

Referring to FIG. 8 together with FIGS. 1 and 7, a method for making a nanowire element 600, particularly a field-effect transistor 600, according to a second embodiment, is shown. The differences between the method of this embodiment and the method of the first embodiment are that the method of this embodiment further includes steps 114 through S116 after the step S112. Step S114: an insulation layer 61 is formed on a conductive pattern layer 60. Step S116: a second conductive layer 62 is formed on the insulation layer 61.

In the step S114, material of the insulation layer 61 is epoxy. The conductive pattern layer 60 includes a first pattern region 601 and a second pattern region 602. The first pattern region 601 is a source electrode of the transistor 600. The second pattern region 602 is a drain electrode of the transistor 600. The second conductive layer 62 is a gate electrode of the transistor 600.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A method for making a nanowire element, comprising steps of:
   providing an imprint mold, the imprint mold comprising a first substrate and a conductive pattern-transferring layer formed on the first substrate, the conductive pattern-transferring layer comprising a plurality of first conductive strips spaced from each other;
   electrifying the conductive pattern-transferring layer with an alternating current;
   applying a nanowire-containing suspension on the conductive pattern-transferring layer, the nanowire-containing suspension containing a plurality of nanowires;
   reorienting the nanowires using a dielectrophoresis method, thereby the nanowires connected between two adjacent first conductive strips;
   providing a pattern-receiving body, the pattern-receiving body comprising a second substrate and a pattern-receiving layer formed on the second substrate;
   pressing the imprint mold onto the pattern-receiving body with the conductive pattern-transferring layer facing the pattern-receiving layer, thereby defining a patterned recess in the pattern-receiving layer and transferring the nanowires to the second substrate;
   forming a first conductive layer on the second substrate to obtain a conductive pattern layer in the pattern-receiving layer, the conductive pattern layer comprising a plurality of second conductive strips spaced from each other, the nanowires connecting two adjacent second conductive strips; and
   removing the pattern-receiving layer.

2. The method of claim 1, wherein the first substrate comprises a silicon base and an imprint pattern layer from on the silicon base, the conductive pattern-transferring layer being formed on the imprint pattern layer.

3. The method of claim 1, wherein material of the second substrate is polyethylene terephthalate and material of the pattern-receiving layer is polymethyl methacrylate.

4. The method of claim 1, further comprising steps of: forming an insulation layer on the conductive pattern layer; and forming a second conductive layer on the insulation layer.

5. The method of claim 4, wherein material of the insulation layer is epoxy.

6. The method of claim 5, wherein the nanowire element is a field-effect transistor.

7. A method for making a nanowire element, comprising steps of:
   providing an imprint mold, the imprint mold comprising a first substrate and a pair of first interdigitated electrodes formed on the first substrate;
   electrifying the first interdigitated electrodes with an alternating current;
   applying a nanowire-containing suspension on the first interdigitated electrodes, the nanowire-containing suspension containing a plurality of nanowires;
   reorienting the nanowires using a dielectrophoresis method, thereby the nanowires being interconnected between first interdigitated electrodes;
   providing a pattern-receiving body, the pattern-receiving body comprising a second substrate and a pattern-receiving polymer layer formed on the second substrate;
   pressing the imprint mold onto the pattern-receiving polymer body with the first interdigitated electrodes facing the pattern-receiving polymer layer, thereby defining a patterned recess in the pattern-receiving polymer layer and transferring the nanowires onto the second substrate;
   forming a first conductive layer on the second substrate in the patterned recess to obtain a pair of second interdigitated electrodes in the pattern-receiving polymer layer, the nanowires electrically contacting the second interdigitated electrodes; and
   removing the pattern-receiving polymer layer.

8. The method of claim 7, wherein the first substrate comprises a silicon base and an imprint pattern layer from on the silicon base, the pair of first interdigitated electrodes being formed on the imprint pattern layer.

9. The method of claim 7, wherein material of the second substrate is polyethylene terephthalate and material of the pattern-receiving layer is polymethyl methacrylate.

10. The method of claim 7, further comprising steps of: forming an insulation layer on the pair of second interdigitated electrodes; and forming a second conductive layer on the insulation layer.

11. The method of claim 10, wherein material of the insulation layer is epoxy.

12. The method of claim 11, wherein the nanowire element is a field-effect transistor.

* * * * *